(12) United States Patent
Takada et al.

(10) Patent No.: US 6,757,946 B2
(45) Date of Patent: Jul. 6, 2004

(54) WIRE BONDING METHOD

(75) Inventors: Norihiko Takada, Kanazawa (JP);
Hisamitsu Kamenaga, Ishikawa-ken (JP); Shingo Iwasa, Matto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/801,384

(22) Filed: Mar. 8, 2001

(65) Prior Publication Data

US 2001/0022484 A1 Sep. 20, 2001

(30) Foreign Application Priority Data

Mar. 17, 2000 (JP) ........................................ 2000-075287

(51) Int. Cl.[7] .............................................. H01L 41/42
(52) U.S. Cl. ................... 29/25.35; 29/850; 310/313 R; 228/110.1
(58) Field of Search ............................... 29/600, 25.35, 29/846, 832, 850; 310/313 R, 363, 364, 348; 228/110.1, 4.5

(56) References Cited

U.S. PATENT DOCUMENTS

| | | | | |
|---|---|---|---|---|
| 3,959,747 A | * | 5/1976 | Turski et al. ............... | 29/25.35 |
| 5,221,449 A | * | 6/1993 | Colgan et al. ......... | 204/192.15 |
| 5,492,263 A | * | 2/1996 | Webster et al. ............. | 228/111 |
| 5,699,027 A | * | 12/1997 | Tsuji et al. .................. | 333/193 |
| 5,818,145 A | * | 10/1998 | Fukiharu ................ | 310/313 R |
| 5,847,486 A | * | 12/1998 | Kadota et al. .......... | 310/313 R |
| 5,920,142 A | * | 7/1999 | Onishi et al. ............ | 310/313 R |
| 5,953,433 A | | 9/1999 | Fujimoto et al. | |
| 6,131,257 A | * | 10/2000 | Nishihara et al. .......... | 29/25.35 |
| 2001/0022484 A1 | * | 9/2001 | Takada et al. .......... | 310/313 R |

FOREIGN PATENT DOCUMENTS

| GB | 2177639 | | 1/1987 |
|---|---|---|---|
| JP | 61-59760 | | 3/1986 |
| JP | 8-124973 | | 5/1996 |
| JP | 9-298442 | * | 11/1997 |
| JP | 10-163790 | | 6/1998 |

* cited by examiner

*Primary Examiner*—Carl J. Arbes
*Assistant Examiner*—Minh Trinh
(74) *Attorney, Agent, or Firm*—Keating & Bennett, LLP

(57) ABSTRACT

A wire bonding method for ultrasonically joining two connecting electrodes with a wire includes the steps of forming at least one of the connecting electrodes with tantalum and forming the wire of one of a metallic wire having a fracture load of about 21 g or greater and a metallic wire having a fracture stress of 290 N/mm² or greater.

6 Claims, 1 Drawing Sheet

WIRE BONDING METHOD

BACKGROUND OF THE INVENTION

1. Field of the Invention

The present invention relates to a wire boding method for connecting two electrodes together with a wire, a surface acoustic wave apparatus and a method for producing a surface acoustic wave apparatus.

2. Description of the Related Art

A wire bonding method has been widely used for electrically connecting electrodes that are separated from each other. Since the surface of a bonding electrode is covered with an oxidized film, in order to attach a bonding wire thereon, the oxidized film must be removed. In an ultrasonic wire bonding method, ultrasonic oscillations are applied to a boding wire so that an oxidized film on the surface thereof is destroyed by sliding of the boding wire, thereby revealing an activated metallic surface. Then, a temperature increases due to frictional heat and a plastic flow causes localized melting, diffusion, and so forth, so that the junction is achieved by metallic bonding.

When such a wire bonding method is applied to surface acoustic wave elements which include an electrode made of a material such as tantalum having a larger specific weight than that of a piezoelectric substrate to excite a Shear Horizontal ("SH-type") surface acoustic wave (Love wave, etc.), as disclosed, for example in U.S. Pat. No. 5,953,433, and U.S. Pat. No. 5,847,486, there arises a problem that a bonding wire is not connected firmly to an electrode of the surface acoustic wave element.

SUMMARY OF THE INVENTION

In order to overcome the problems described above, preferred embodiments of the present invention provide a wire bonding method by which a bonding wire is strongly connected to a tantalum electrode of a surface acoustic wave element, and provide a surface acoustic wave apparatus formed by using the above-described wire bonding method to have high junction strength and high electrical reliability and a method for producing a surface acoustic wave apparatus.

According to one preferred embodiment of the present invention, a wire bonding method for ultrasonically joining two connecting electrodes with a wire includes the steps of forming at least one of the connecting electrodes with tantalum and forming the wire of one of a metallic wire having a fracture load of about 21 g or greater and a metallic wire having a fracture stress of 290 N/mm$^2$ or greater.

According to preferred embodiments of the present invention, by using a wire having large strength (breaking stress is large), plastic deformation is minimized and ultrasonic energy is effectively applied to the junction surface at the tantalum layer. Thereby, the strong junction due to the metallic bonding between the bonding wire and the tantalum layer is achieved, so that the bonding wire can be directly and reliably joined to the tantalum layer.

Furthermore, it is not necessary to form an additional electrode made from a material such as Au or Al on the tantalum layer, so that the number of manufacturing steps is greatly reduced, resulting in reduced cost.

For the fracture load, it is preferable that the bonding wire use an aluminum alloy wire, in particular use an Al—Si wire. By adding a very small amount of Si to the aluminum, the fracture load is greatly improved.

The wire bonding method according to preferred embodiments of the present invention may be preferably applied to a surface acoustic wave apparatus. That is, the method may be applied to a surface acoustic wave apparatus including a package having an element-mounting surface and a surface acoustic wave element fixed on the element-mounting surface of the package, the surface acoustic wave element including a piezoelectric substrate and IDTs and bonding electrodes disposed on the upper surface of the piezoelectric substrate, the bonding electrode of the surface acoustic wave element and an external connecting electrode of the package are connected together by an ultrasonic bonding wire method according to other preferred embodiments of the present invention. Thus, such a surface acoustic wave apparatus is prepared by a process including the steps of using tantalum for the IDT and bonding electrodes of the surface acoustic wave element, and using one of a bonding wire having a fracture load of about 21 g or greater and a bonding wire having a fracture stress of about 290 N/mm$^2$ or greater for a bonding wire. Thereby, the large junction strength between the bonding wire and the bonding electrode formed by a tantalum layer can be obtained, so that even when a dropping impact is applied thereto, the bonding wire can be prevented from being removed from the bonding electrode.

For the purpose of illustrating the present invention, there is shown in the drawings several forms that are presently preferred, it being understood, however, that the present invention is not limited to the precise arrangements and instrumentalities shown.

Other features, elements, characteristics and advantages of the present invention will become more apparent from the detailed description of preferred embodiments below with reference to the attached drawings.

DETAILED DESCRIPTION OF PREFERRED EMBODIMENTS

Hereinafter, preferred embodiments of the present invention are explained in detail with reference to the drawings.

Figure 1:
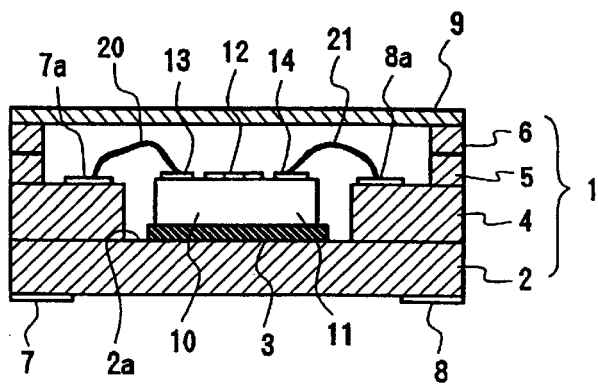
FIG. 1 is a sectional view of an example of a surface acoustic wave apparatus made by using a wire bonding method according to a preferred embodiment of the present invention.

FIG. 1 shows an example of a surface acoustic wave apparatus using a wire bonding method according to preferred embodiments of the present invention.

The surface acoustic wave apparatus preferably includes a package 1 having an element mounting surface 2a and a surface acoustic wave element 10 fixed on the element mounting surface 2a of the package 1. The package 1 preferably has a cavity shape which is formed by laying up a bottom board 2 and side walls 4, 5, and 6, which are preferably made from ceramic, or other suitable material, and electrodes 7 and 8 for external connection are formed so as to extend outside from inside. In this preferred embodiment, the electrodes 7 and 8 for external connection are preferably made from Au, Cu, Al, or other suitable material, and electrode pads 7a and 8a which are electrically connected to the electrodes 7 and 8 are formed on the upper surface of the side wall 4. On the upper surface of the side wall 6, a ceramic or metallic lid board 9 is fixed by adhesion, seam welding, brazing, or other suitable method so as to hermetically seal the inside thereof.

The package 1 is not limited to a cavity shape. It may be formed to hermetically seal the inside by fixing the surface acoustic wave element 10 on a planar substrate and joining a cap on the substrate so as to cover the element.

The surface acoustic wave element 10 is fixed on the element mounting surface 2a of the package 1 so as to interpose an adhesive 3 therebetween. The surface acoustic wave element 10 preferably generates a SH-type surface acoustic wave and includes a piezoelectric substrate 11 made of a piezoelectric material such as lithium tantalate, lithium niobate, and crystal, an IDT electrode 12, and bonding electrodes 13 and 14. The electrodes 12, 13 and 14 are preferably made from a tantalum layer and formed on the surface of the piezoelectric substrate 11. The bonding electrodes 13 and 14 and the electrode pads 7a and 8a of the package 1 are joined together via bonding wires 20 and 21 by an ultrasonic wire bonding method. The bonding wires 20 and 21 are preferably made of a metallic wire having a fracture load of about 21 g or greater, and in this preferred embodiment a wire made of an Al-Si alloy having a diameter of about 30 μm is preferably used.

When the diameter and the fracture load of a bonding wire are about 30 μm and about 21 g or greater, respectively, the breaking stress thereof is as described below.

The cross-sectional area S of the wire having a diameter of about 30 μm is: $S=\pi \times (0.03)^2/4$ mm$^2$; therefore, the breaking stress $=21/S \cong 290$ N/mm$^2$.

Accordingly, with a metallic material having a breaking stress of about 290 N/mm$^2$ or more, the wire bonding can be suitably performed even when using a wire having a diameter less than about 30 μm.

According to the research on the wire bonding method by the inventors, when a bonding electrode is constructed from a tantalum layer, it is difficult for a plastic flow to occur while a large portion of ultrasonic energy is transmitted to the bonding wire to produce a plastic flow (deformation) because the bonding wire is softer, so that the energy is not so transmitted to a junction surface. Accordingly, although the deformation of the bonding wire is large, the junction to the bonding electrode is insufficient, resulting in problems of junction failure of the wire or reduced tensile strength of the wire.

On the contrary, according to preferred embodiments of the present invention, high strength bonding wires 20 and 21 having a fracture load of about 21 g or greater are used, so that the plastic deformation of the bonding wires 20 and 21 is minimized, and thereby the ultrasonic energy has a very beneficial effect on the junction surface between the bonding wires 20 and 21 and the bonding electrodes 13 and 14. Accordingly, the sliding due to the ultrasonic oscillation occurs between the bonding wires 20 and 21 and the bonding electrodes 13 and 14, so that localized melting and diffusion, etc., due to the frictional heat by the sliding are produced, and the strong junction achieved by metallic bonding is thereby produced.

The bonding wires 20 and 21 may be first connected to either the electrode pads 7a and 8a or to the bonding electrodes 13 and 14. In the preferred embodiment described above, the primary bonding is performed on the bonding electrodes 13 and 14 of the surface acoustic wave element 10 while the secondary bonding is performed on the electrode pads 7a and 8a of the package 1. However, the primary bonding may be performed on the electrode pads 7a and 8a while the secondary bonding may be performed on the bonding electrodes 13 and 14.

Figure 2:
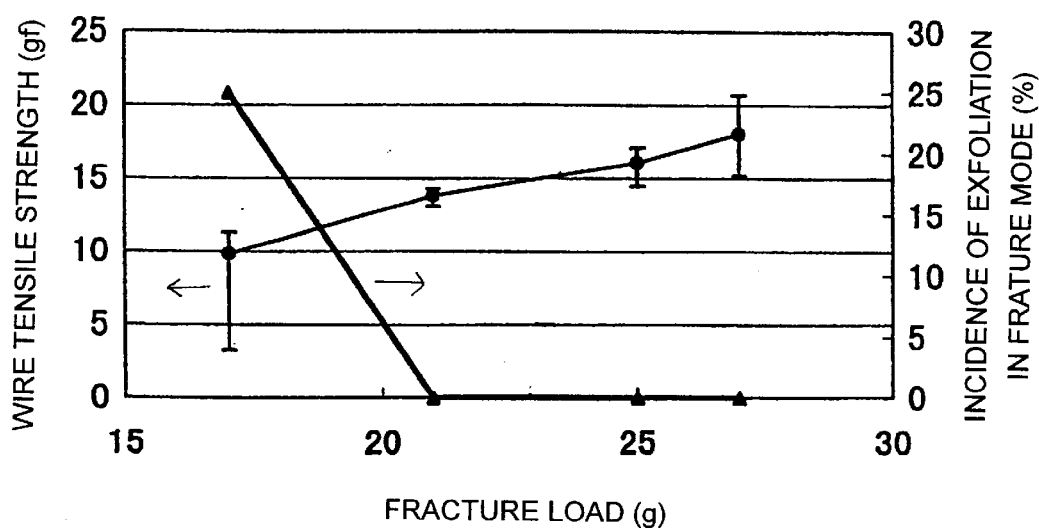
FIG. 2 is a drawing showing the relationship between the tensile strength and the incidence of exfoliation in the breaking mode with regard to the wire fracture load.

FIG. 2 shows an evaluation of the bonding strength when the hardness of the bonding wire is changed. In this evaluation, a wire of Al-1% Si having a diameter of about 30 μm as the bonding wire and a bonding tool having an inline-groove shape were used. A wire tensile test was adopted for the joining strength, and the joining strength and a wire-breaking mode were measured. It is shown that the higher incidence of exfoliation in the breaking mode (breaking in an interface between the bonding electrode and the bonding wire) is, the worse the junction state is.

As understood from FIG. 2, when the wire fracture load is about 21 g or greater, exfoliation in the breaking mode is not produced and the tensile strength is also very large. From this fact, the satisfactory junction state can be understood.

In the preferred embodiment described above, the wire bonding method according to the present invention is applied to the surface acoustic wave apparatus. However, the bonding method of the present invention is applicable to an electronic component as long as it has a connecting electrode made from a tantalum layer. The connecting electrode made from a tantalum layer is not necessarily limited to the electronic component element side, and it may be arranged on the package side.

The connecting electrode made from a tantalum layer may be on any one of the primary and secondary sides. However, it is preferable that the bonding method according to preferred embodiments of the present invention be applied to the primary side because the ultrasonic energy is sufficiently applied thereto.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A wire bonding method for ultrasonically joining two connecting electrodes with a wire, the wire bonding method comprising the steps of:

forming at least one of the connecting electrodes with tantalum;

forming the wire from one of a metallic wire having a fracture load of about 21 g or greater and a metallic wire having a fracture stress of about 290 N/mm$^2$ or greater; and connecting the two connecting electrodes with the wire.

2. A method according to claim 1, wherein the wire is an aluminum alloy wire having the fracture load of about 21 g or greater.

3. A method according to claim 1, wherein the wire is an Al—Si wire.

4. A method according to claim 1, wherein the wire has fracture load of about 21 g or greater.

5. A method according to claim 1, wherein the wire has a fracture stress of about 290 N/mm$^2$ or greater.

6. A method according to claim 1, wherein the wire is an aluminum alloy wire having the fracture stress of about 290 N/mm$^2$ or greater.

* * * * *